United States Patent
Lin et al.

(10) Patent No.: US 8,415,795 B2
(45) Date of Patent: Apr. 9, 2013

(54) SEMICONDUCTOR DEVICE AND ASSEMBLING METHOD THEREOF

(75) Inventors: Yu-Min Lin, Changhua County (TW); Chau-Jie Zhan, New Taipei (TW); Su-Tsai Lu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 154 days.

(21) Appl. No.: 13/089,289

(22) Filed: Apr. 18, 2011

(65) Prior Publication Data
US 2012/0161336 A1 Jun. 28, 2012

(30) Foreign Application Priority Data
Dec. 28, 2010 (TW) ................ 99146360 A

(51) Int. Cl.
*H01L 21/44* (2006.01)
*H01L 23/48* (2006.01)
*H01L 23/52* (2006.01)
*H01L 29/40* (2006.01)

(52) U.S. Cl. . 257/737; 257/738; 257/358; 257/E23.021; 257/E23.023; 257/E21.508; 438/613; 438/614; 438/615

(58) Field of Classification Search .......... 438/613–615; 257/737, 738; 228/180.22; 148/528
See application file for complete search history.

(56) References Cited

U.S. PATENT DOCUMENTS 6,342,442 B1  1/2002  Angst et al.
7,319,048 B2 *  1/2008  Lu et al. ............... 438/106
8,092,621 B2 *  1/2012  Ho et al. ............... 148/528
8,143,722 B2 *  3/2012  Curtis et al. ........... 257/738
2010/0127047 A1 *  5/2010  Ho et al. ............... 228/198

OTHER PUBLICATIONS

Yu et al., "Electromigration Study of 50 μm pitch Micro Solder Bumps using Four-Point Kelvin Structure", Electronic Components and Technology Conference, May 26-29, 2009, pp. 930-935.
Zhan et al., "Assembly and Reliability Characterization of 3D Chip Stacking with 30 μm Pitch Lead-Free Solder Micro Bump Interconnection", Electronic Components and Technology Conference (ECTC), Jun. 1-4, 2010, pp. 1043-1049.
Huang et al., "Electromigration of Cu-Sn-Cu Micropads in 3D Interconnect", Electronic Comonents and Technology Conference, May 27-30, 2008, pp. 12-17.
Nah et al., "Electromigration in Pb-free Solder Bumps with Cu col. as Flip Chip Joints", Electronic Components and Technology Conference, 2006, pp. 657-662.
Liang et al., "Electromigration Failure with Thermal Gradient Effect in SnAgCu Solder Joints with Various UBM", Electronic Components and Technology Conference, May 26-29, 2009, pp. 909-913.

* cited by examiner

*Primary Examiner* — David Zarneke
(74) *Attorney, Agent, or Firm* — Jianq Chyun IP Office

(57) ABSTRACT

A semiconductor device and an assembling method thereof are provided. The semiconductor device includes a chip, a carrier, a plurality of first conductive elements and a plurality of second conductive elements. The chip has a plurality of first pads. The carrier has a plurality of second pads. The second pads correspond to the first pads. Each first conductive element is disposed between one of the first pads and one of the second pads. Each second conductive element is disposed between one of the first pads and one of the second pads. A volume ratio of intermetallic compound of the second conductive elements is greater than a volume ratio of intermetallic compound of the first conductive elements.

14 Claims, 9 Drawing Sheets

SEMICONDUCTOR DEVICE AND ASSEMBLING METHOD THEREOF

CROSS-REFERENCE TO RELATED APPLICATION

This application claims the priority benefit of Taiwan application serial no. 99146360, filed Dec. 28, 2010. The entirety of the above-mentioned patent application is hereby incorporated by reference herein and made a part of this specification.

BACKGROUND

1. Technical Field

The disclosure relates to a semiconductor device and an assembling method thereof. Particularly, the disclosure relates to a semiconductor device using a flip chip bonding technique, and an assembling method thereof.

2. Description of Related Art

In a flip chip bonding process, there are two conventional damage modes that influence product reliability. One is mechanical damage, for example, during a temperature cycle reliability test, residual stress may cause joint damage due to excessive difference of thermal expansion coefficients of different materials. Another one is that voids may appear on a solder joint due to an electromigration effect caused by a high current, which influences a joint quality and a joint strength.

On the other hand, during assembling of the solder joints or a process of high temperature reflow, intermetallic compound (IMC) can be generated on an interface of the solder joints due to the high temperature, a material hardness of the IMC is generally harder than that of the original solder joint, and the IMC has a higher rigidity and is lack of flexibility, which is liable to be damaged during the temperature cycle reliability test. However, the IMC has a characteristic of slowing the electromigration effect, and a resistance capability of the solder joints for the electromigration effect can be improved by improving the content of the IMC.

SUMMARY

The disclosure provides a semiconductor device including a first chip, a carrier, a plurality of first conductive elements and a plurality of second conductive elements. The first chip has a plurality of first pads. The carrier has a plurality of second pads. The second pads correspond to the first pads. Each first conductive element disposed between one of the first pads and one of the second pads. Each second conductive element disposed between one of the first pads and one of the second pads. A composition ratio of intermetallic compound of the second conductive elements is greater than a composition ratio of intermetallic compound of the first conductive elements.

The disclosure provides an assembling method of a semiconductor device, which includes following steps. A plurality of first pads of a chip electrically connected to a plurality of second pads of a carrier through a plurality of first conductive elements. A part of the first conductive elements heated to form a plurality of second conductive elements, and a composition ratio of intermetallic compound of the second conductive elements is greater than a composition ratio of intermetallic compound of the first conductive elements.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

The disclosure is directed to a semiconductor device, which can avoid damages caused by thermal stress and an electromigration effect.

The disclosure is directed to an assembling method of a semiconductor device, where the assembled semiconductor device can avoid damages caused by thermal stress and an electromigration effect.

The disclosure is directed to the semiconductor device and the assembling method thereof, the conductive elements with different composition ratios of the intermetallic compound can resist damages caused by the thermal stresses and the electromigration effect.

Figure 1:
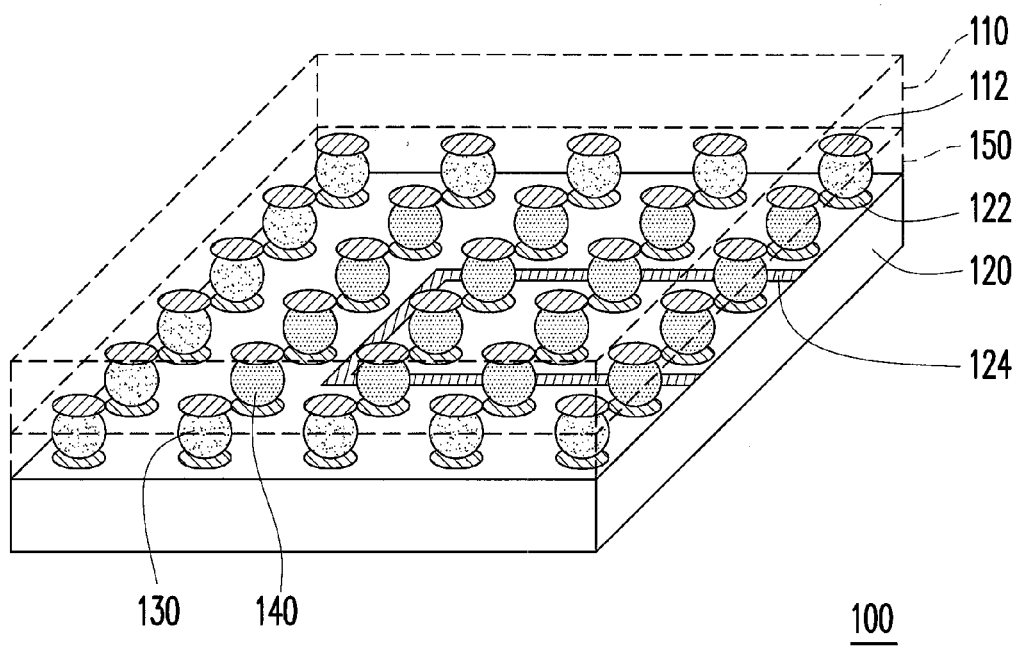
FIG. 1 is a perspective view of a semiconductor device according to an exemplary embodiment of the disclosure.

FIG. 1 is a perspective view of a semiconductor device according to an exemplary embodiment of the disclosure. Referring to FIG. 1, the semiconductor device 100 of the embodiment includes a chip 110, a carrier 120, a plurality of first conductive elements 130 and a plurality of second conductive elements 140. The chip 110 has a plurality of first pads 112. The carrier 120 has a plurality of second pads 122. Each first conductive element 130 disposed between one of the first pads 112 and one of the second pads 122. Each second conductive element 140 disposed between one of the first pads 112 and one of the second pads 122. A volume ratio of intermetallic compound (IMC) of the second conductive elements 140 is greater than a composition ratio of IMC of the first conductive elements 130. In the embodiment, the difference of the composition ratios of the IMC of the first conductive element 130 and the second conductive element 140 is formed when the semiconductor device 100 is manufactured, or is formed after the semiconductor device is sold.

For example, a material of the first conductive element 130 is tin-silver, and a material contact the first conductive element 130 is copper, the IMC in the second conductive element 140 is probably a tin-copper compound (for example, $Cu_3Sn$ or $Cu_6Sn_5$). Alternatively, the material of the first conductive element 130 is tin-silver-copper, and the material contact the first conductive element 130 is nickel, the IMC in the second conductive element 140 is probably a tin-nickel-copper compound (for example, $(Cu,Ni)_3Sn_4$ or $(Cu,Ni)_6Sn_5$). As the material of the first conductive element 130 is different to the material contact the first conductive element 130, a plurality of different IMCs can be simultaneously formed, for example. A percentage of the so-called volume ratio of the IMC is a total volume of the IMC relative to a total volume of the conductive element.

In the semiconductor device 100 of the embodiment, thermal expansion coefficients of the chip 110 and the carrier 120 are probably different, and during a temperature variation process that the temperature of the semiconductor device 100 is increased due to operation or is decreased due to non-operation, the first conductive elements 130 located between the chip 110 and the carrier 120 can bear relatively large thermal stress without being damaged due to relatively less volume ratio of the IMC and lower rigidity and hardness.

On the other hand, the second conductive elements 140 with relatively large volume ratio of the IMC have better resistance capability for the damage caused by an electromigration effect. Therefore, when the second conductive elements 140 serve as a conducting path of a large current, reliability of the semiconductor device 100 is improved.

The volume ratio of the IMC of the second conductive elements 140 even has a chance to be substantially 100%. Therefore, even the second conductive elements 140 serve as a main current input path, it can still greatly reduce possibility of the damage caused by the electromigration effect. Moreover, in the embodiment, the two types of conductive elements with different volume ratios of the IMC are taken as an example, though in other embodiments, more types of the conductive elements with different volume ratios of the IMC can also be simultaneously used.

The carrier 120 of the embodiment is, for example, a circuit substrate. However, in other embodiments, the carrier 120 can also be another chip. In other words, the technique of fabricating the conductive elements of different volume ratios of the IMC can be applied between the chip and the circuit substrate, and can also be applied between two chips or applied to other devices using the conductive elements as the electrical transmission path. Namely, the semiconductor device 100 of the embodiment can be formed by stacking a plurality of chips, and as long as the semiconductor device 100 includes the two types of conductive elements with different volume ratios of the IMC, it is considered to be within the protection scope of the disclosure.

The semiconductor device 100 of the embodiment further includes an underfill material 150 filled between the chip 110 and the carrier 120 and wrapping the first conductive elements 130 and the second conductive elements 140. The underfill material 150 is used to wrap the exposed parts of the first conductive elements 130 and the second conductive elements 140, and simultaneously slow the thermal stresses generated between the chip 110 and the carrier 120 due to the temperature variation, and further prevent external moisture from entering internal of the semiconductor device 100.

The carrier 120 of the embodiment further includes at least one heating loop 124. The heating loop 124 is electrically isolated to the second pads 122, namely, the heating loop 124 is not electrically connected to the second pads 122. Moreover, the heating loop 124 is adjacent to the second conductive elements 140. After a current is input to the heating loop 124, a temperature of the heating loop 124 is gradually increased due to the resistance thereof, and temperatures of the adjacent second conductive elements 140 are also increased. On the other hand, increasing of the temperatures of the first conductive elements 130 relatively far away from the heating loop 124 is less than that of the second conductive elements 140. Since the volume ratio of the IMC is increased as the temperature is increased, the first conductive elements 130 and the second conductive elements 140 with different volume ratios of the IMC are generated under a function of the heating loop 124. After the semiconductor device 100 is manufactured, the current of the heating loop 124 is cut off, and it is unnecessary to take out the heating circuit 124, which can be used to increase heat-dissipation efficiency of the working semiconductor device 100.

Figure 2:
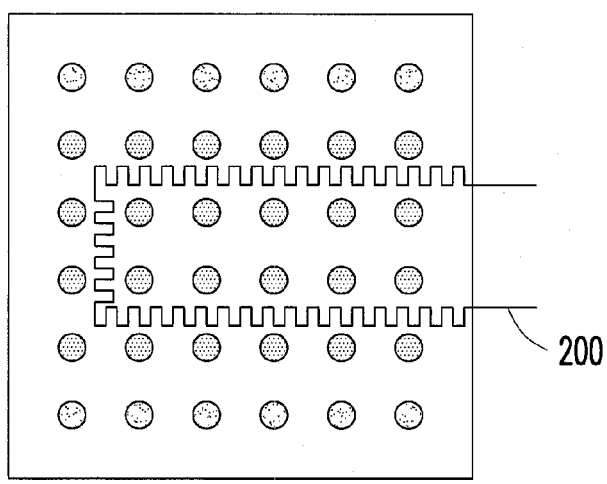
FIG. 2 is a diagram of a heating loop.

Moreover, a shape, a length and a resistance of the heating loop can be changed to increase the temperature of the second conductive elements heated by the heating loop, so as to effectively increase the volume ratio of the IMC of the second conductive elements. For example, a heating loop 200 of FIG. 2 can be designed to be battlements-like to increase a loop length to achieve higher resistance.

Figure 3A:
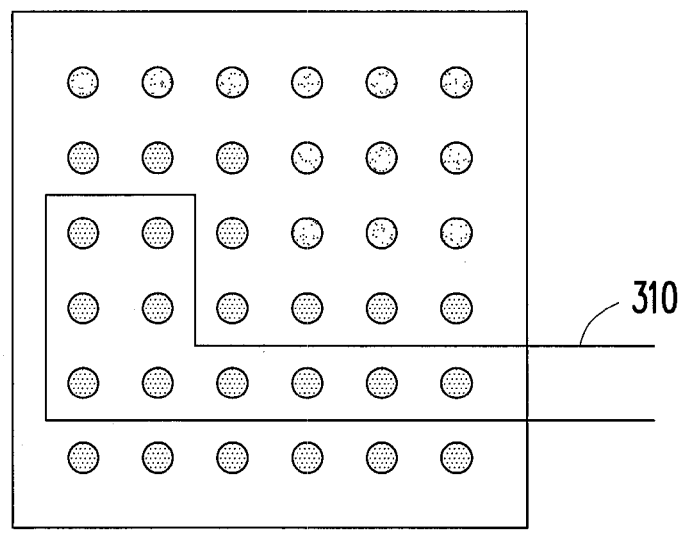
FIGS. 3A-3C respectively illustrates layouts of three heating loops.
Figure 3B:
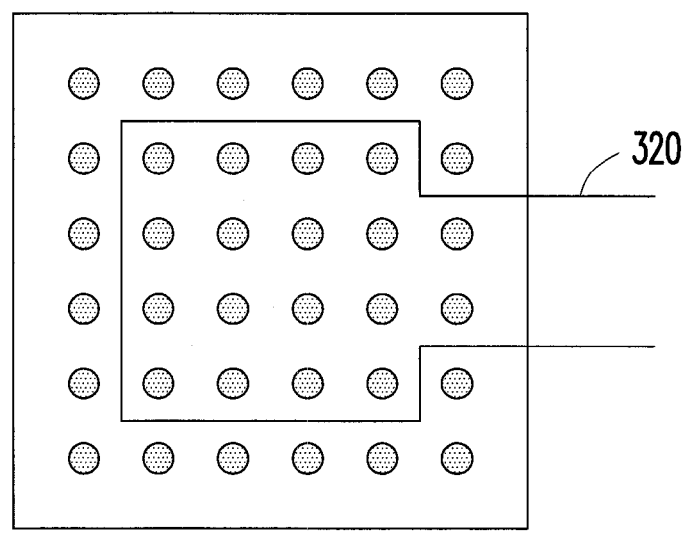
Figure 3C:
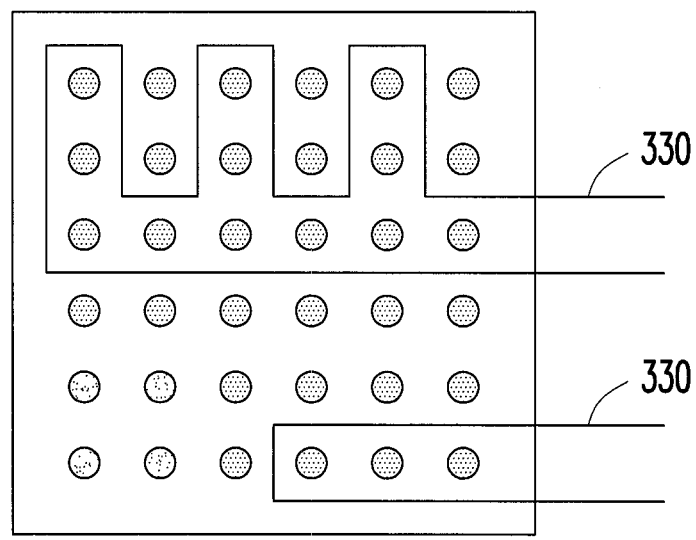

Moreover, a layout of the heating loop is determined according to positions of the second conductive elements required to generate relatively higher volume ratio of the IMC. For example, FIGS. 3A-3C respectively illustrates layouts of three heating loops 310, 320 and 330. In FIG. 3C, the number of the heating loops 330 is two, and the number of the heating loops 330 can be further increased according to an actual design requirement. Therefore, the heating loop of the exemplary embodiments of the disclosure can be designed into different geometric shapes to heat the first conductive elements and the second conductive elements.

Relative positions of the first conductive elements and the second conductive elements can also be suitably adjusted, and a main consideration thereof is to configure the second conductive elements with higher volume ratio of the IMC at positions liable to have the electromigration effect due to a large current amount during utilization, and configure the first conductive elements with lower volume ratio of the IMC at positions bearing larger thermal stresses. FIGS. 4A-4F are diagrams respectively illustrating six arrangements of first conductive elements 410 and second conductive elements 420.

Figure 4A:
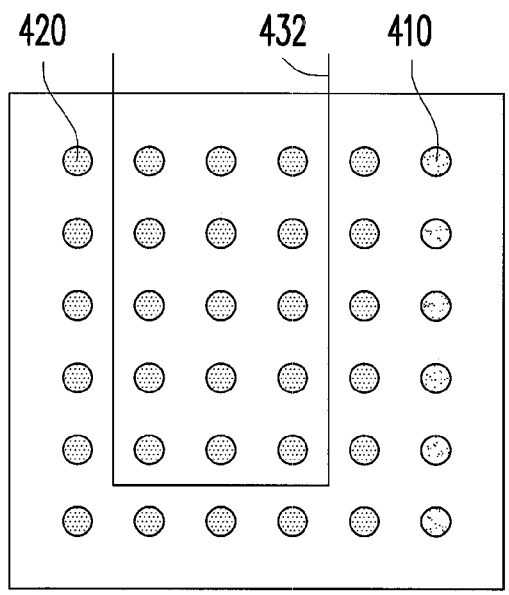
FIGS. 4A-4F are diagrams respectively illustrating six arrangements of first conductive elements and second conductive elements.
Figure 4B:
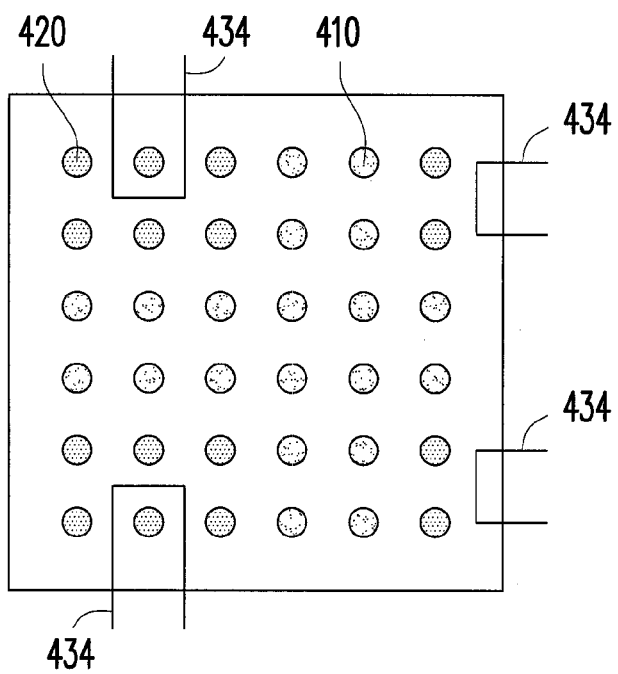
Figure 4C:
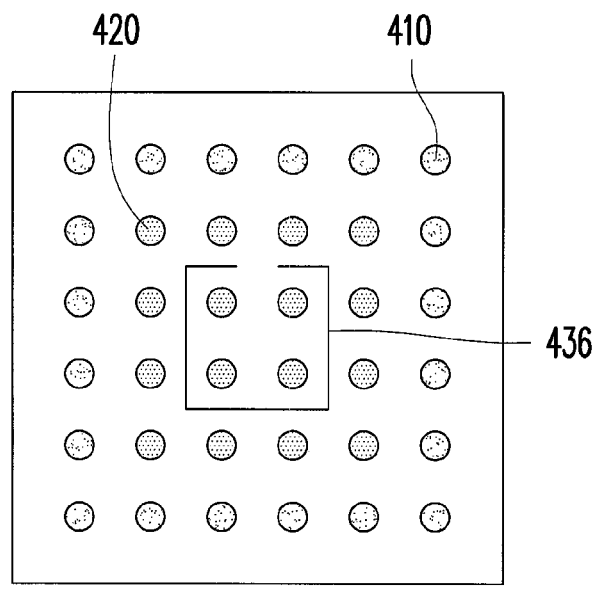
Figure 4D:
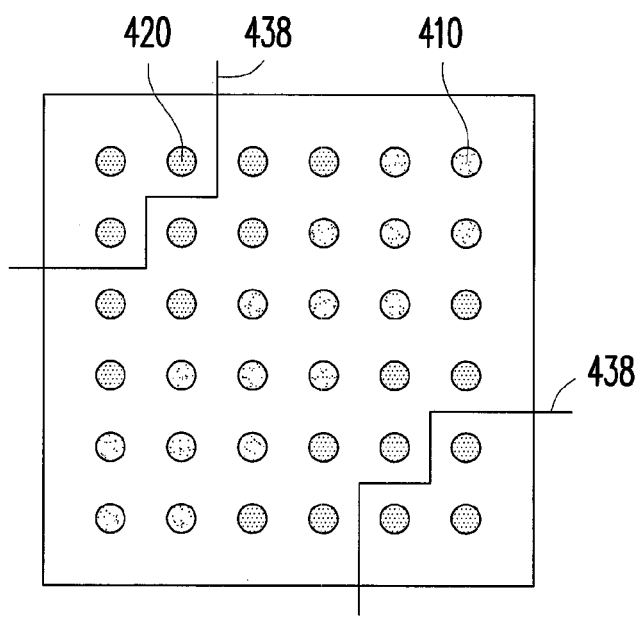
Figure 4E:
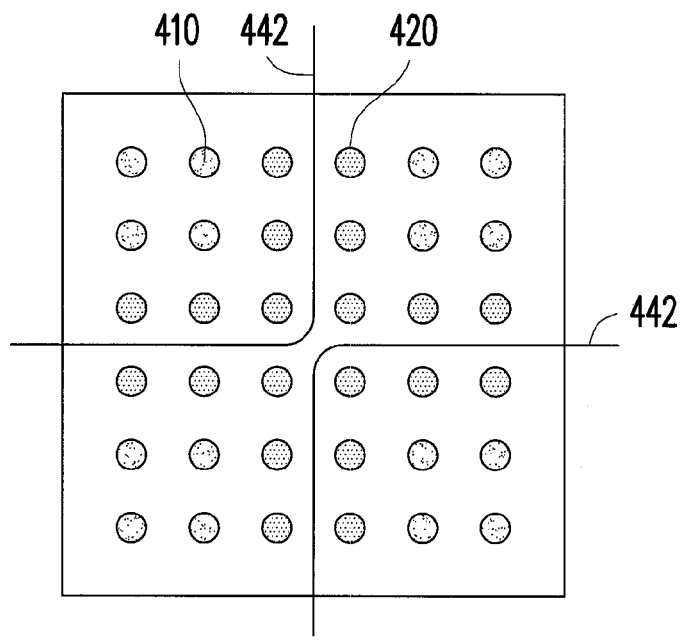
Figure 4F:
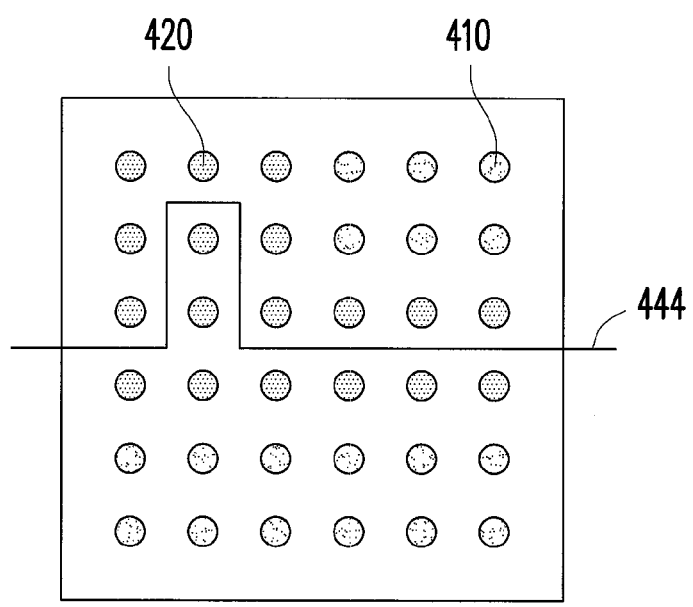

In FIG. 4A, the first conductive elements 410 are distributed at one side of the chip, and the second conductive elements 420 are distributed at most of the other regions. In order to achieve such distribution effect, a heating loop 432 can be predisposed in the region of the second conductive elements 420. In FIG. 4B, the first conductive elements 410 are distributed on the chip in an approximate T-shape, and the second conductive elements are disposed in other regions. Heating loops 434 can be predisposed in the region of the second conductive elements 420. In FIG. 4C, the first conductive elements 410 are disposed at periphery of the second conductive elements 420. A heating loop 436 can be predisposed in the region of the second conductive elements 420, and the current can be input along a direction perpendicular to a surface of the chip. In FIG. 4D, the first conductive elements 410 are disposed along a diagonal of the chip, and the second conductive bumps 420 are disposed at other regions in symmetric. A heating loop 438 can be predisposed in the region of the second conductive elements 420. In FIG. 4E, the second conductive elements 420 are disposed on the chip in a cross shape, and the first conductive elements 410 are disposed at other regions. A heating loop 442 can be predisposed in the region of the second conductive elements 420. In FIG. 4F, the second conductive elements 420 are disposed on the chip in an L-shape, and the first conductive elements 410 are disposed at other regions. A heating loop 444 can be predisposed in the region of the second conductive elements 420.

Figure 5:
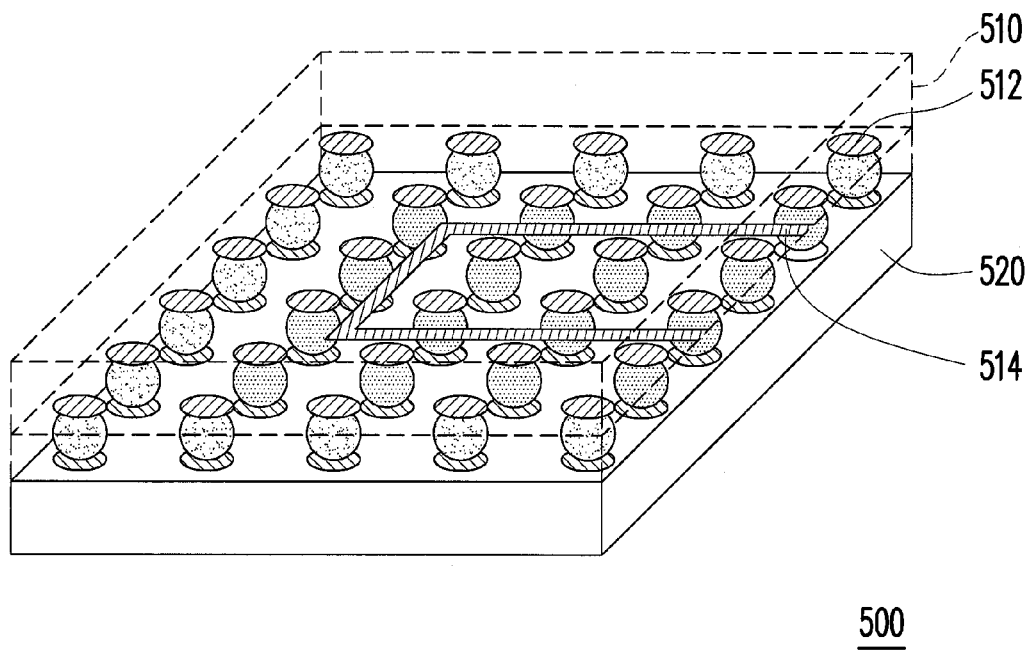
FIG. 5 is a perspective view of a semiconductor device according to another exemplary embodiment of the disclosure.

FIG. 5 is a perspective view of a semiconductor device according to another embodiment of the disclosure. Referring to FIG. 5, the semiconductor device 500 of the embodiment is similar to the semiconductor device 100 of FIG. 1, and a difference there between is that a carrier 520 of the embodiment does not include the heating loop, while a chip 510 has at least one heating loop 514. The heating loop 514 is isolated to the first pads 512, and is located adjacent to the second conductive elements 140. Namely, utilization methods, functions and possible variations of the heating loop 514 are the same to that of the heating loop 124 of FIG. 1.

Figure 6:
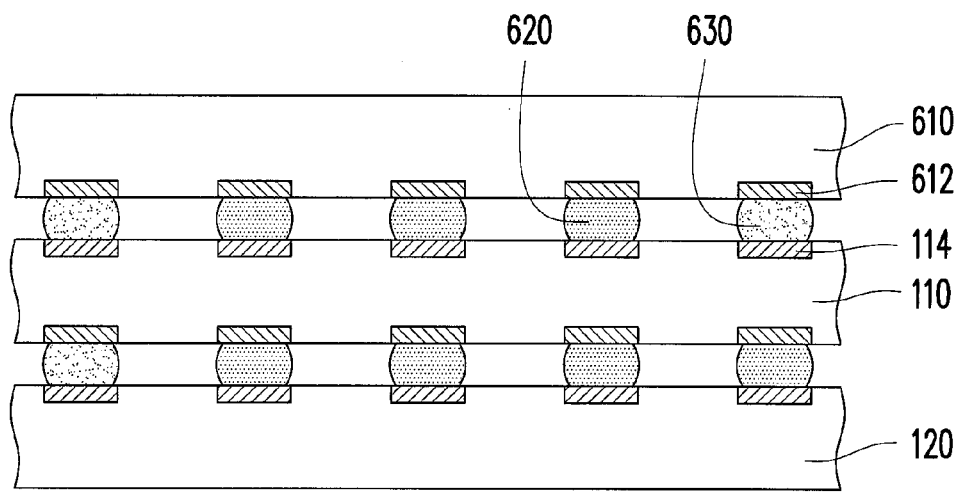
FIG. 6 is a partial cross-sectional view of a semiconductor device according to still another exemplary embodiment of the disclosure.

FIG. 6 is a partial cross-sectional view of a semiconductor device according to still another embodiment of the disclosure. Referring to FIG. 6, the semiconductor device 600 of the embodiment is similar to the semiconductor device 100 of FIG. 1, and a difference there between is that the semiconductor device 600 of the embodiment further includes a chip 610, a plurality of third conductive elements 620 and a plurality of fourth conductive elements 630. The chip 610 has a plurality of third pads 612. The chip 110 disposed between the chip 610 and the carrier 120, and the chip 110 further has a plurality of fourth pads 114. Each third conductive element 620 disposed between one of the third pads 612 and one of the fourth pads 114. Each fourth conductive element 630 disposed between one of the third pads 612 and one of the fourth pads 114. A volume ratio of intermetallic compound of the third conductive elements 620 is greater than a volume ratio of intermetallic compound of the fourth conductive elements 630. Namely, the technique of fabricating the conductive elements of different volume ratios of the IMC can also be applied to the chip-stacked semiconductor device 600 to improve reliability of the chip-stacked semiconductor device 600.

Figure 7:
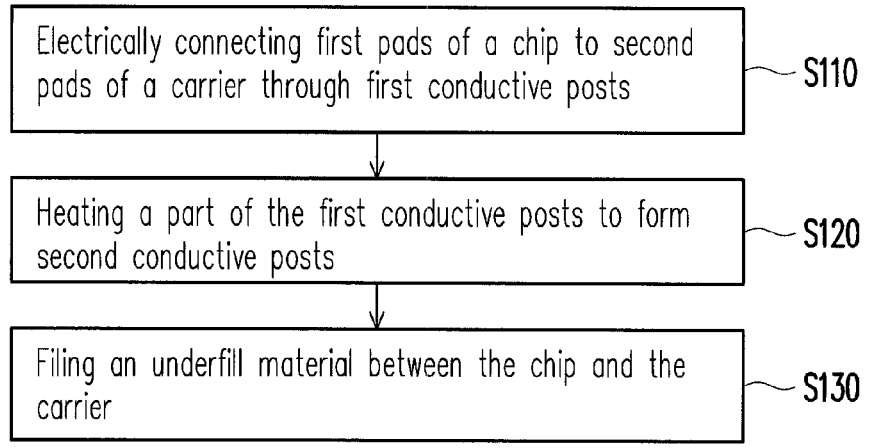
FIG. 7 is a flowchart illustrating an assembling method of a conductive device according to an exemplary embodiment of the disclosure.
Figure 8A:
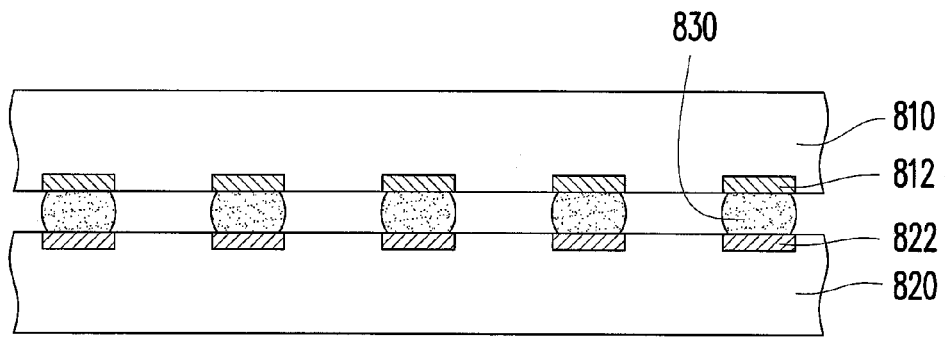
FIGS. 8A-8C are cross-sectional views of a semiconductor device of FIG. 7 during an assembling process.
Figure 8B:
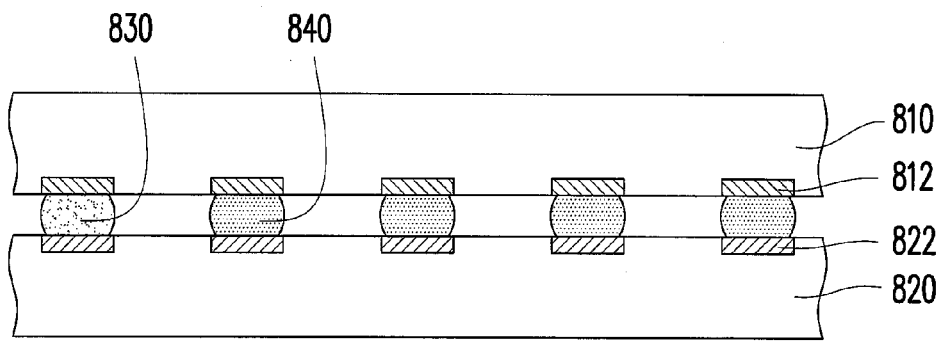
Figure 8C:
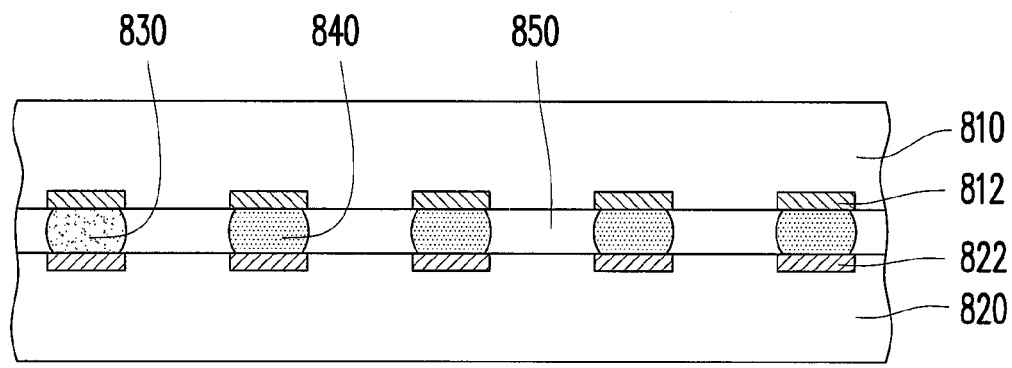

FIG. 7 is a flowchart illustrating an assembling method of a conductive device according to an embodiment of the disclosure, and FIGS. 8A-8C are cross-sectional views of the semiconductor device of FIG. 7 during the assembling process. Referring to FIG. 7 and FIG. 8A, according to the assembling method of the semiconductor device of the embodiment, in step S110, a plurality of first pads 812 of a chip 810 is electrically connected to a plurality of second pads 822 of a carrier 820 through a plurality of first conductive elements 830. Now, all of the conductive elements between the first pads 812 and the second pads 822 are the first conductive elements 830, and compositions of all of the first conducive elements 830 are substantially the same without considering a fabrication process difference. The first conductive element 830 can be formed by a bump (not shown) on the first pad 812, a bump (not shown) on the second pad 822 and a solder between the two bumps. Materials of the two bumps can be tin-lead alloy, gold or other conductors. Moreover, under bump metallurgy (UBM) can be formed between the first pads 812 and the bumps, and the UBM can also be formed between the second pads 822 and the bumps. In addition, the first conductive element 830 can also be only formed by a bump (not shown) on the first pad 812 and a bump (not shown) on the second pad 822, and the two bumps are bonded through laser or other methods. Those skilled in the art should understand that methods of forming the first conductive elements 830 are diversified, which are not described in detail herein.

Then, referring to FIG. 7 and FIG. 8B, in step S120, a part of the first conductive elements 830 is heated to form a plurality of second conductive elements 840, and a volume ratio of IMC of the second conductive elements 840 is greater than a volume ratio of IMC of the first conductive elements 830. In detail, the volume ratio of the IMC of the heated first conductive elements 830 is increased, and the first conductive elements 830 with the increased volume ratio of the IMC are referred to as the second conductive elements 840, so as to form to two types of conductive elements with different volume ratios of the IMC. Methods for heating the first conductive elements 830 to form the second conductive elements 840 are plural, and one of the methods is to heat the first conductive elements 830 by using the heating loop 124 of the carrier 120 of FIG. 1 or the heating loop 514 of the chip 519 of FIG. 5. According to experiments, the method of heating the first conductive elements by applying power to the heating loop may even form the second conductive elements with the volume ratio of the IMC of 100%.

Referring to FIG. 7 and FIG. 8C, after the second conductive elements 840 are formed, in step S130, an underfill material 850 can be selectively filled between the chip 810 and the carrier 820. The underfill material 850 is the same to the underfill material 150 of FIG. 1.

Figure 9:
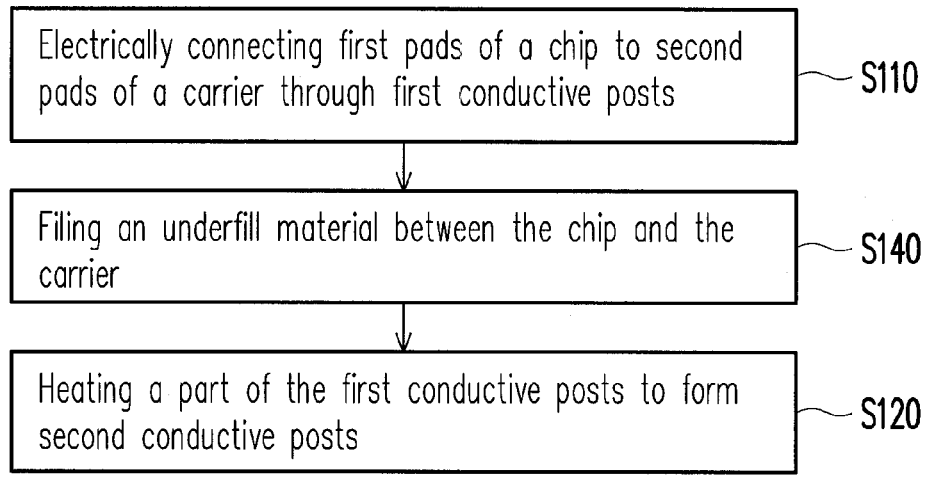
FIG. 9 is a flowchart illustrating an assembling method of a semiconductor device according to an exemplary embodiment of the disclosure.

FIG. 9 is a flowchart illustrating an assembling method of a semiconductor device according to an embodiment of the disclosure. Referring to FIG. 9, the assembling method of the semiconductor device of the embodiment is similar to that of the embodiment of FIG. 7, and a difference there between is that a step S140 of filling the underfill material is performed after the step S110 of electrically connecting the first pads to the second pads and before the step S120 of forming the second conductive elements.

In summary, in the semiconductor device and the assembling method thereof, two types of the conductive elements with different volume ratios of the IMC are formed. The conductive elements with smaller volume ratio of the IMC may have better resistance capability for the thermal stresses, and the conductive elements with larger volume ratio of the IMC have better resistance capability for the electromigration effect. Therefore, the semiconductor device and the assembling method thereof of the disclosure have better reliability.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor device, comprising:
a first chip, having a plurality of first pads;
a carrier, having a plurality of second pads, the second pads corresponding to the first pads;
a plurality of first conductive elements, respectively disposed between one of the first pads and one of the second pads; and
a plurality of second conductive elements, respectively disposed between one of the first pads and one of the second pads, wherein the first conducive elements and the second conductive elements are formed from the same material, a volume ratio of intermetallic compound of the second conductive elements after being heated is greater than a volume ratio of intermetallic compound of the first conductive elements.

2. The semiconductor device as claimed in claim 1, wherein the volume ratio of intermetallic compound of the second conductive elements is substantially 100%.

3. The semiconductor device as claimed in claim 1, wherein the carrier is a circuit substrate or another chip.

4. The semiconductor device as claimed in claim 1, further comprising an underfill material filled between the first chip and the carrier and wrapping the first conductive elements and the second conductive elements.

5. The semiconductor device as claimed in claim 1, wherein the first chip further has at least one heating loop electrically isolated to the first pads and located adjacent to the second conductive elements.

6. The semiconductor device as claimed in claim 5, wherein the heating loop is battlement like.

7. The semiconductor device as claimed in claim 1, wherein the carrier further has at least one heating loop electrically isolated to the second pads and located adjacent to the second conductive elements.

8. The semiconductor device as claimed in claim 7, wherein the heating loop is battlement like.

9. The semiconductor device as claimed in claim 1, further comprising:
   a second chip, having a plurality of third pads, wherein the first chip is located between the second chip and the carrier, and the first chip further has a plurality of fourth pads;
   a plurality of third conductive elements, respectively disposed between one of the third pads and one of the fourth pads; and
   a plurality of fourth conductive elements, respectively disposed between one of the third pads and one of the fourth pads, wherein a volume ratio of intermetallic compound of the third conductive elements is greater than a volume ratio of intermetallic compound of the fourth conductive elements.

10. An assembling method of a semiconductor device, comprising:
    electrically connecting a plurality of first pads of a chip to a plurality of second pads of a carrier through a plurality of first conductive elements formed of the same material; and
    heating a part of the first conductive elements to form a plurality of second conductive elements, wherein a volume ratio of intermetallic compound of the second conductive elements after being heated is greater than a volume ratio of intermetallic compound of the first conductive elements.

11. The assembling method of the semiconductor device as claimed in claim 10, wherein after the second conductive elements are formed, the method further comprises filling an underfill material between the chip and the carrier, wherein the underfill material wraps the first conductive elements and the second conductive elements.

12. The assembling method of the semiconductor device as claimed in claim 10, wherein after the step of electrically connecting the first pads to the second pads and before the step of forming the second conductive elements, the method further comprises filling an underfill material between the chip and the carrier, wherein the underfill material wraps the first conductive elements and the second conductive elements.

13. The assembling method of the semiconductor device as claimed in claim 10, wherein the step of forming the second conductive elements comprises powering at least a heating loop of the chip, wherein the heating loop is electrically isolated to the first pads and located adjacent to the second conductive elements.

14. The assembling method of the semiconductor device as claimed in claim 10, wherein the step of forming the second conductive elements comprises powering at least a heating loop of the carrier, wherein the heating loop is electrically isolated to the second pads and located adjacent to the second conductive elements.

* * * * *